(12) United States Patent
Lin et al.

(10) Patent No.: US 6,602,619 B2
(45) Date of Patent: Aug. 5, 2003

(54) ORGANIC EL DEVICE

(75) Inventors: Tung-Shen Lin, Tainan (TW); Kun-Tay Yeh, Tainan (TW)

(73) Assignee: Lightronik Technology Inc., Tainan (TW)

( * ) Notice: Subject to any disclaimer, the term of this patent is extended or adjusted under 35 U.S.C. 154(b) by 0 days.

(21) Appl. No.: 09/982,011

(22) Filed: Oct. 19, 2001

(65) Prior Publication Data

US 2003/0129448 A1 Jul. 10, 2003

(51) Int. Cl.$^7$ .............................. H05B 33/12
(52) U.S. Cl. .................. 428/690; 428/917; 313/504; 313/506
(58) Field of Search .................. 428/690, 917; 313/504, 506

(56) References Cited

U.S. PATENT DOCUMENTS

| | | | | |
|---|---|---|---|---|
| 5,281,489 A | * | 1/1994 | Mori et al. .................. | 428/690 |
| 5,587,112 A | * | 12/1996 | Kauffman et al. .......... | 252/589 |
| 6,111,063 A | | 8/2000 | Park et al. .................. | 528/423 |
| 6,124,046 A | | 9/2000 | Jin et al. .................... | 428/690 |

FOREIGN PATENT DOCUMENTS

| | | | |
|---|---|---|---|
| JP | 59075257 A | * | 4/1984 |
| JP | 61-37890 | | 2/1986 |
| JP | 01-245087 | | 9/1989 |
| JP | 02-209988 | | 8/1990 |
| JP | 02-247277 | | 10/1990 |
| JP | 02-247278 | | 10/1990 |
| JP | 03-33183 | | 2/1991 |
| JP | 03-33184 | | 2/1991 |
| JP | 03-47890 | | 2/1991 |
| JP | 03-84089 | | 4/1991 |
| JP | 03-231970 | | 10/1991 |
| JP | 04-117485 | | 4/1992 |
| JP | 04-275268 | | 9/1992 |
| JP | 05-17765 | | 1/1993 |
| JP | 05-140145 | | 6/1993 |
| JP | 05-247459 | | 9/1993 |
| JP | 08-20771 | | 1/1996 |
| JP | 08-40995 | | 2/1996 |
| JP | 08-40997 | | 2/1996 |
| JP | 08-53397 | | 2/1996 |
| JP | 08-87122 | | 4/1996 |
| JP | 09-157642 | | 6/1997 |

OTHER PUBLICATIONS

W. Helfrich et al. "Transients of Volume–Control Current and of Recombination Radiation in Anthracene", The Journal of Chemical Phys. 44, 1965, pp. 2902–2909. (no month).

C. W. Tang et al. "Organic Electroluminescent Diodes", Appl. Phys. Lett. 51, Sep. 1987, pp. 913–915.

C. W. Tang et al. "Electroluminescence of Doped Organic Thin Films", J. Appl. Phys. 65, May 1989, pp. 3610–3616.

\* cited by examiner

Primary Examiner—Marie Yamnitzky
(74) Attorney, Agent, or Firm—Intellectual Property Solutions, Incorporated

(57) ABSTRACT

An organic EL device which contains an anode, a cathode, and at least one organic thin-film layer including a light emitting layer which contains a compound represented by the following formulae (1) or (2)

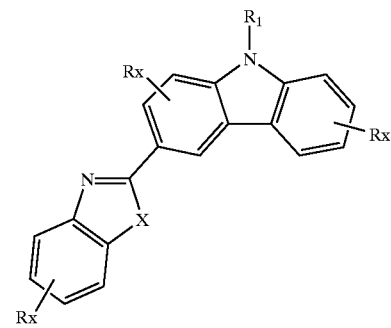

(1)

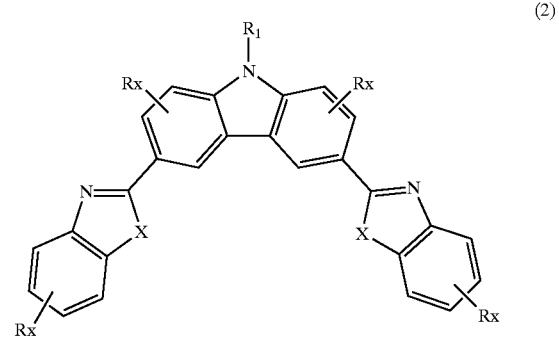

(2)

wherein $R_1$ represents a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, or a substituted or unsubstituted alkoxycarbonyl group; and Rx is one or more functional groups represented by a hydrogen atom, halogen atom, nitro group, cyano group, carboxyl group, or $R_1$. Any two Rx groups may form a ring. X represents oxygen atom, nitrogen atom and sulfur atom. A blue organic EL device can be provided according to the present invention.

6 Claims, 3 Drawing Sheets

ORGANIC EL DEVICE

BACKGROUND OF THE INVENTION

1. Field of the Invention

This invention relates to a luminescent material for an organic EL device having excellent light-emitting properties.

2. Description of the Related Art

An organic electroluminescent device (organic EL device) is a light emitting device, containing a fluorescent material which emits light in response to the recombination of holes and electrons that are injected from anode and cathode. For example, C. W. Tang et al. reported an organic EL device using a double-layered structure (Applied Physics Letters, 51,913 (1987)). This organic EL device, which has tris (8-hydroxyquinolinol aluminum) in a light-emitting layer and a triphenyldiamine derivative in hole-transporting layer, greatly enhances the luminescence properties.

To further improve luminescence efficiency, a method of doping a fluorescent dye had been utilized. For example, an organic EL device with a coumarin dye as the doping material (Applied Physics Letters, 65,3610 (1989)) has been used to greatly improve the luminescence efficiency. For improving the recombination efficiency of the injected hole and electron, multi-layered devices have been introduced. As a hole-transporting material, triphenylamine derivatives such as 4, 4', 4"-tris (3-methylphenylphenylamino)-triphenylamine and aromatic diamine derivatives such as N, N'-diphenyl-N, N' bis (3-methylphenyl)-[1,1'-biphenyl]-4, 4'diamine are well known (see Japanese Patent Application Laid-Open Nos. 20771/1996, 40995/1996, 40997/1996, 53397/1996, and 87122/1996). As an electron-transporting material, triazole derivatives and the like are also known.

Examples of the blue light emissive material for organic EL device include condensed polycyclic aromatic compounds such as anthracene, pyrene, and perylene (J. Chem. Phys., 44, 2902 (1996)), tetraphenylbutadiene-based compounds, distyrylbenzene-based compounds, stilbene-based compounds and polyphenyl-based compounds. (unexamined published Japanese patent application JP-A-61-37890, JP-A-1-245087, JP-A-2-247227, JP-A-2-247278, JP-A-2-209988, JP-A-3-33184, JP-A-3-84089, JP-A-3-231970, JP-A-4-117485, JP-A-4-275268, JP-A-5-17765, JP-A-140145, JP-A-3-47890, JP-A-3-33183, JP-A-5-247459, and JP-A-9-157642). However, these compounds have problems in durability, color purity, and luminescence efficiency.

SUMMARY OF THE INVENTION

An object of the present invention is to provide a high performance material and to provide an organic EL device having blue luminescence. The present invention uses a specific N-substituted carbazole compound as a light emitting material to provide an organic EL device having high color purity and luminescence. The organic EL device comprises an anode, cathode and one or more organic thin film layers which contain, either singly or as a mixture, an N-substituted carbazole compound represented by the following formula (1) or (2)

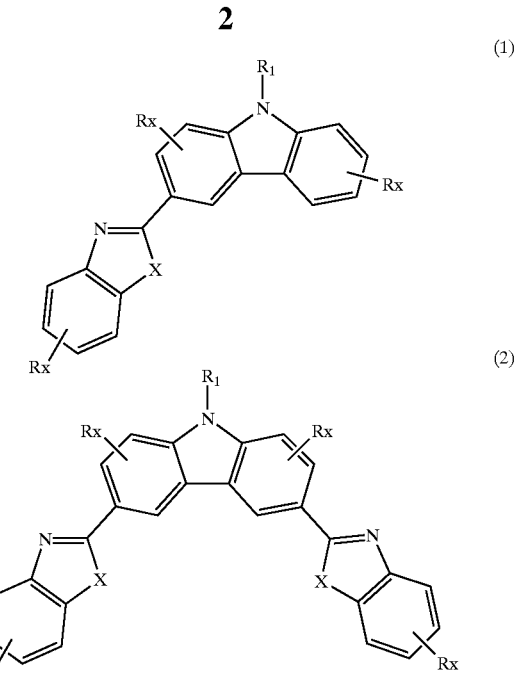

Wherein $R_1$ represents a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, or a substituted or unsubstituted alkoxycarbonyl group; and Rx is one or more functional groups represented by a hydrogen atom, halogen atom, nitro group, cyano group, carboxyl group, or $R_1$. Any two Rx groups may form a ring. X represents an oxygen atom, an NH group or a sulfur atom. A blue organic EL device can be provided according to the present invention.

DETAILED DESCRIPTION OF THE INVENTION

Figure 1:
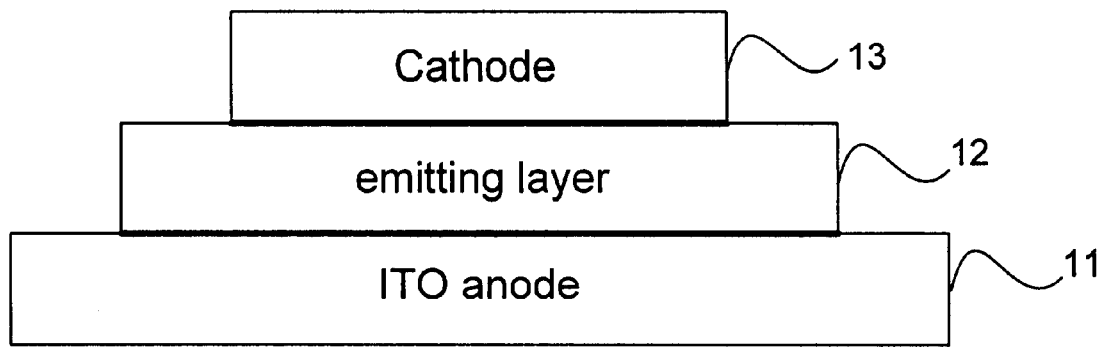
FIG. 1 illustrates a construction of an organic EL element of the present invention.

The present invention will hereinafter be described specifically. The N-substituted carbazole compound represented by the following formula (1) or formula (2) is used in the organic EL device. In the present invention, there are one or more benzothiazole groups, benzoimidazole or benzoxazole groups substituted on the aromatic ring of the carbazole to provide a good path of the resonance electron to emit blue light. As a result, a good color purity blue light-emitting properties are obtained as compared to other polycarbazole compounds (e.g., U.S. Pat. Nos. 6,111,063 and 6,124,046). For the N-substituted groups of the carbazole, it is preferred to select aromatic ring with a high molecular weight group such as 4-(N, N bis p-methylphenyl) phenyl (see compound 1-1). According to formula (1), a substituted amino group is substituted on the position-3 of carbazole (see compound 1-4) will get a better emitting property. In formulae (1) and (2), $R_1$ represents a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, or a substituted or unsubstituted alkoxycarbonyl group; Rx means that there are one or more functional groups representing a hydrogen atom, a halogen atom, a nitro group, a cyano group, a carboxyl group, or the same as that of $R_1$. Any two of the Rx groups may form a ring. X represents an oxygen atom, an NH group or a sulfur atom. Referring to the following reaction scheme, a synthesis method for the N-substituted carbazole compound represented by the formula (1) or formula (2) of the present invention will be described.

The N-substituted carbazole is represented by the following formula (3):

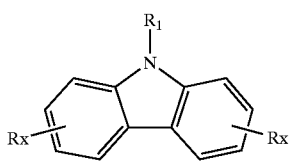

(3)

wherein $R_1$ and Rx have the same meanings as described above, and are reacted with phosphorus oxy-chloride and N, N-dimethylformamide to provide the N-substituted carbazole carboxaldehyde represented by the following formulae (4) and (4-1)

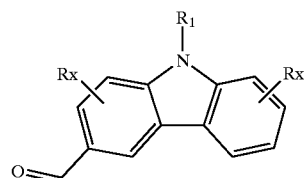

(4)

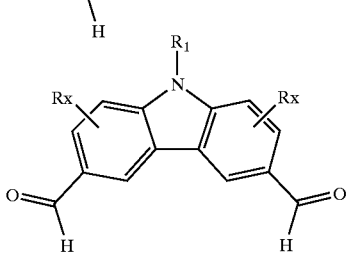

(4-1)

Then, the N-substituted carbazole carboxaldehyde represented by the above formulae (4) and (4-1) are reacted with the aminothiophenol derivatives as represented by the following formula (5), or with aminophenol derivatives as represented by the following formula (5-1), or with phenylenediamine derivatives as represented by the following formula (5-2) to provide the N-substituted carbazole compound represented by the formulae (1) and (2).

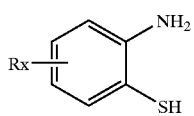

(5)

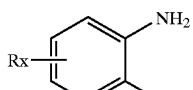

(5-1)

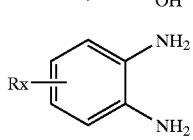

(5-2)

Rx has the same meaning as discussed above. Examples of the N-substituted carbazole compounds as represented by the formulae (1) and (2) used in the organic EL device of the present invention are shown below. However, the present invention is not limited thereto.

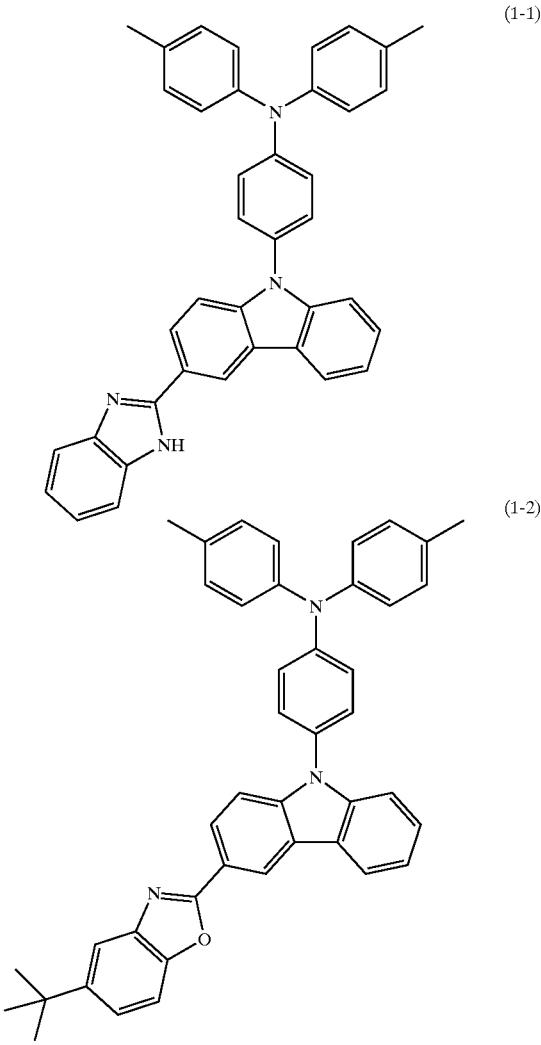

(1-1)

(1-2)

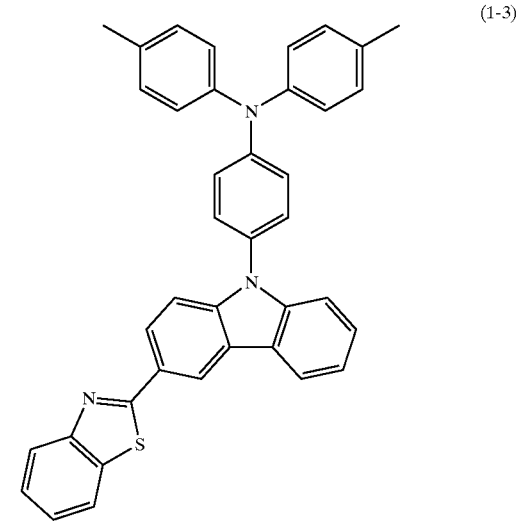

(1-3)

(1-4)
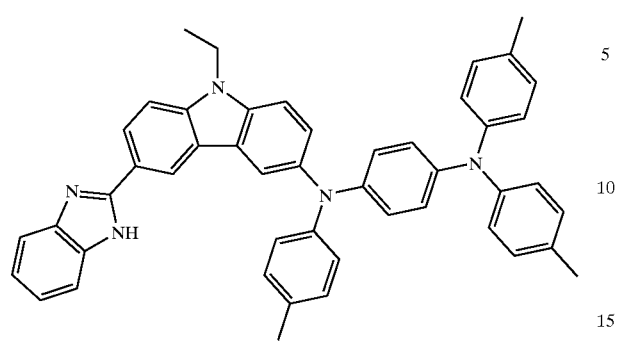
(1-5)
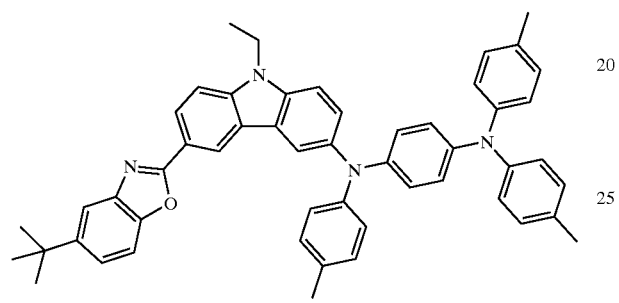
(1-6)
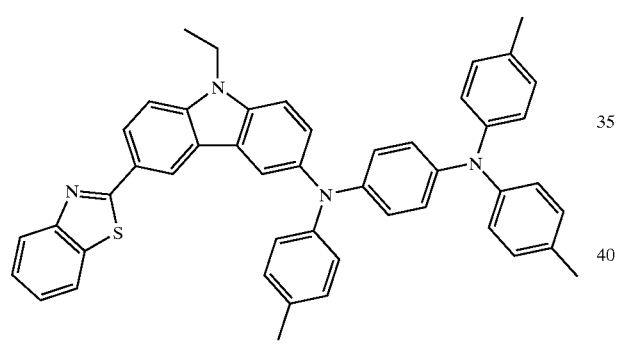
(2-1)
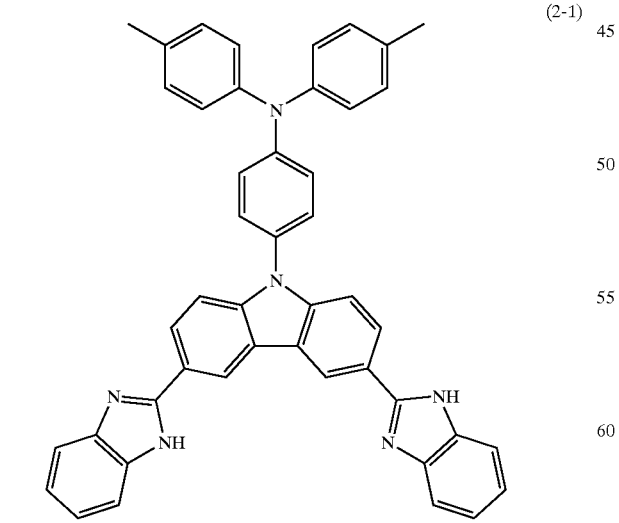
(2-2)
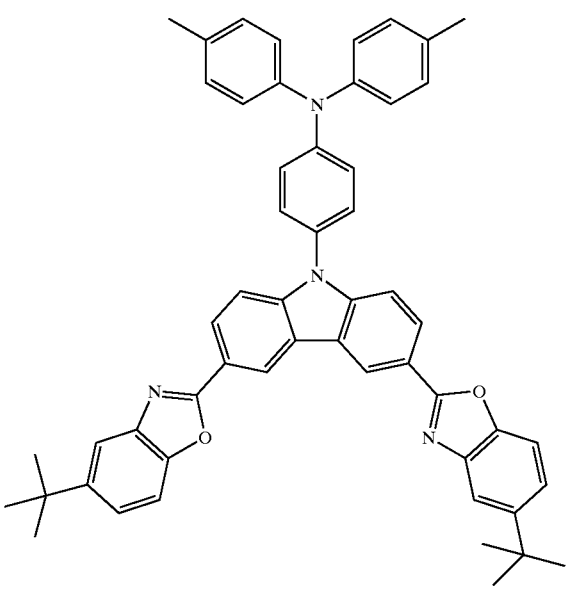
(2-3)
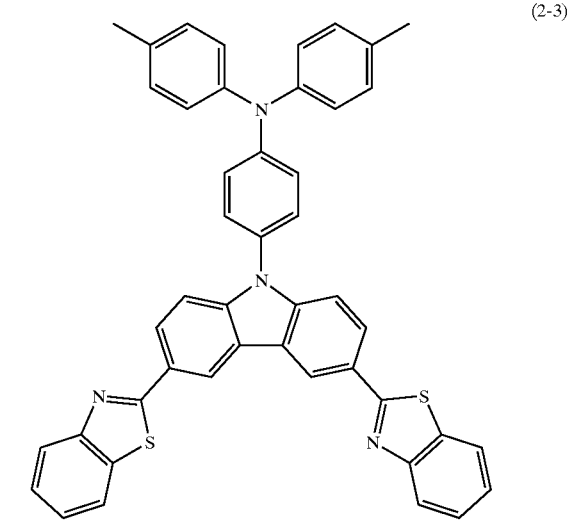
(2-4)
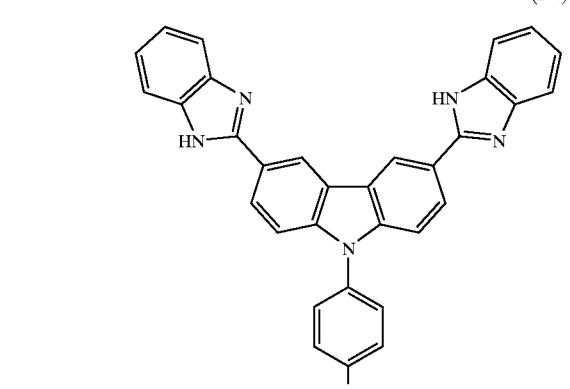

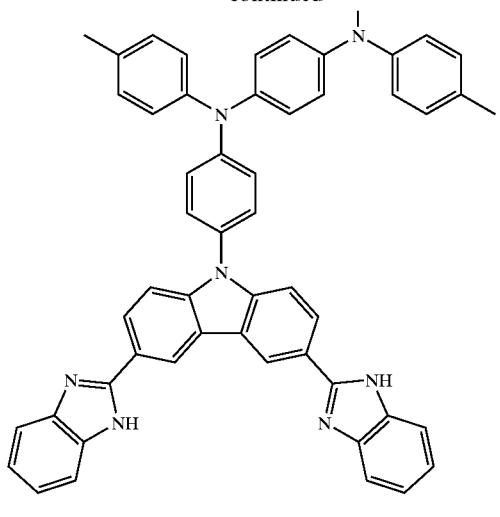

(2-5)

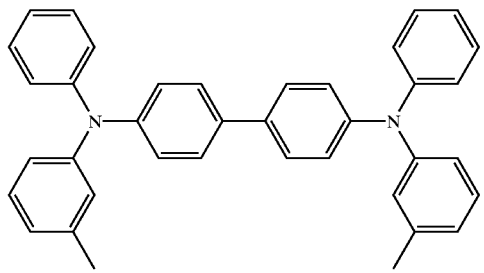

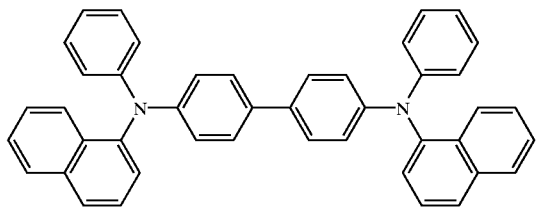

The organic EL device according to the present invention has a multi-layered structure including a light emitting layer, hole transporting layer, and electron transporting layer. Methods of selecting hole transporting material and electron transporting material are well known. Examples of hole transporting materials are shown below and represented by formula (A) through formula (E). Examples of electron transporting materials are shown below and represented by formula (F) through formula (J). The anode material of the organic EL device used in this present invention is indium tin oxide (ITO), and the cathode material is aluminum.

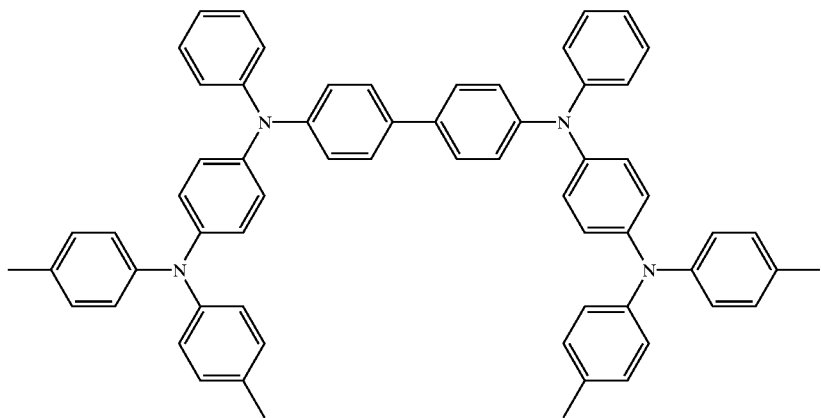

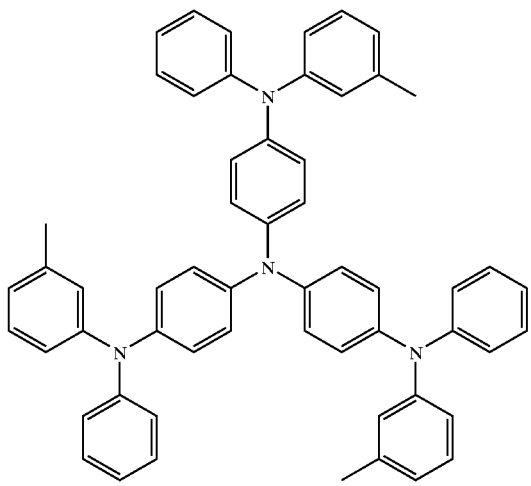
(D)
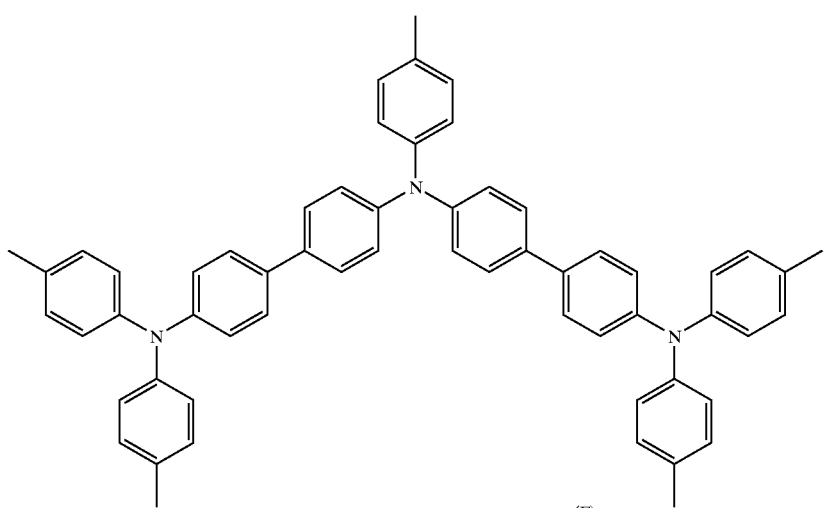
(E)
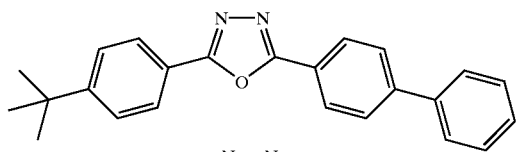
(F)
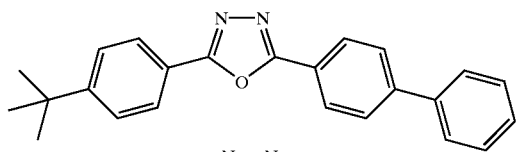
(G)
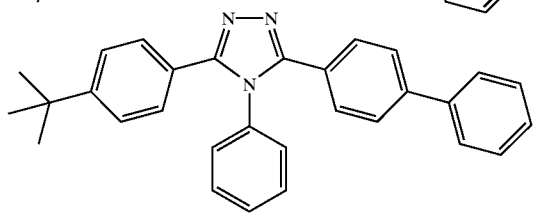
(H)
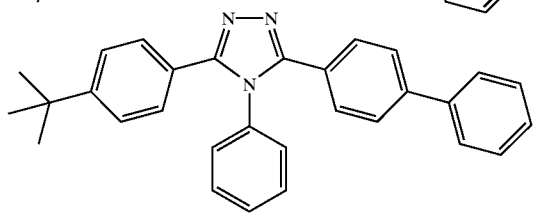
(I)
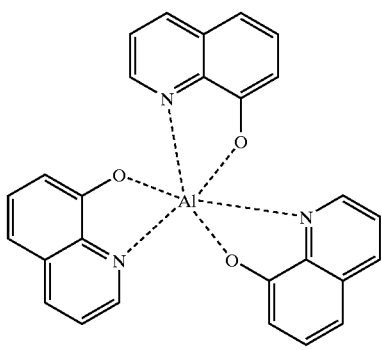
(J)

The present invention will hereafter be described in detail with reference to examples, but the present invention is not limited only to the following examples unless the spirit or scope of the invention is changed.

SYNTHESIS EXAMPLE 1

Synthesis of compounds (K-1), (K-2) and (K-3) are listed in Table 1 as follows:

TABLE 1

| Starting material | Reagent (X)/method A | product |
| --- | --- | --- |
| carbazole | | (K-1) |
| carbazole | | (K-2) |
| | | (K-3) |

Method A: Starting material and 1.1 eq of reagent(X) in o-dichlorobenzene, add 1.5 eq of KOH, 1.5 eq of Cu powder, reaction under argon at suitable temperature from 150° C. to 190° C. at least 6 hours to get product.

Compounds K-1, K-2, K-3 then react with POCl3/DMF to get single product with formylation at position 3 of carbazole and formylation at both position 3 and 6 of carbazole. Finally, reacting with compounds (5), (5-1), and (5-2) in presence of acetic acid anhydride and use DMF as a solvent to get compounds (1-1) to (1-6), (2-1) to (2-5). The $H^1$-NMR data of these compounds are list in table (2).

The $H^1$-NMR dates are listed in Table 2 as follows:

TABLE 2

| Compound | $^1$H-NMR (CDCl$_3$, TMS) |
| --- | --- |
| 1-1 | (ppm) = 2.4(s, 6H, —CH$_3$), 6.9–8.3(m, 23H, aromatic, carbazole H and —NH), 8.8(s, 1H, carbazole H) |
| 1-2 | (ppm) = 1.5(s, 9H, —C(CH$_3$)$_3$), 2.4(s, 6H, —CH$_3$), 7.0–8.3(m, 21H, aromatic, carbazole H), 8.9(s, 1H, carbazole H) |
| 1-3 | (ppm) = 2.5(s, 6H, —CH$_3$), 6.9–8.3(m, 22H, aromatic, carbazole H), 8.8(s, 1H, carbazole H) |
| 1-4 | (ppm) = 1.5(t, 3H, —CH$_3$), 2.5(s, 9H, —CH$_3$), 4.4(q, 2H, —N—CH$_2$), 6.8–8.3(m, 26H, aromatic, carbazole H and —NH), 8.9(s, 1H, carbazole H) |
| 1-5 | (ppm) = 1.4–1.6(m, 12H, —CH$_3$) 2.4(s, 9H, —CH$_3$), 4.4(q, 2H, —N—CH$_2$), 7.0–8.5(m, 24H, aromatic, carbazole H), 8.9(s, 1H, carbazole H) |
| 1-6 | (ppm) = 1.5(t, 3H, —CH$_3$), 2.5(s, 9H, —CH$_3$), 4.4(q, 2H, —N—CH$_2$), 6.9–8.6(m, 25H, aromatic, carbazole H), 8.8(s, 1H, carbazole H) |
| 2-1 | (ppm) = 2.4(s, 6H, —CH$_3$), 6.9–8.4(m, 26H, aromatic, carbazole H and —NH), 8.9(s, 2H, carbazole H) |
| 2-2 | (ppm) = 1.4(s, 18H, —C(CH$_3$)$_3$), 2.4(s, 6H, —CH$_3$), 7.0–8.4(m, 22H, aromatic, carbazole H), 8.9(s, 2H, carbazole H) |
| 2-3 | (ppm) = 2.5(s, 6H, —CH$_3$), 7.0–8.6(m, 24H, aromatic, carbazole H), 8.9(s, 2H, carbazole H) |
| 2-4 | (ppm) = 2.3(s, 6H, —CH$_3$), 6.9–8.6(m, 48H, aromatic, carbazole H and —NH), 8.9(s, 4H, carbazole H) |
| 2-5 | (ppm) = 2.3(s, 6H, —CH$_3$), 6.9–8.6(m, 44H, aromatic, carbazole H ), 8.9(s, 4H, carbazole H) |

The present invention regarding production of organic EL device is further discussed below. Examples of used glass substrates with ITO electrode having a surface resistance of 20 ($\Omega$/□) as the anode are also illustrated.

EXAMPLE 1

As the structure shown in FIG. 1, a 80 mg PVK (poylvinylcarbazole), 15 mg compound (H) and 3 mg compound (1-1) are dissolved in 10 ml 1,2-dichloroethane. An organic thin film is formed as an emitting layer 12 by spin coating on the anode 11. Moreover, an aluminum cathode 13 is formed by vacuum deposition on the organic layer. When a dc voltage 21 V is applied to the resulting device, a blue light emission is obtained. In the similar manner as applied to example 1, example 2 through example 11 are fabricated and the results listed in Table 3 as follows:

TABLE 3

| Example | Compound | Brightness (cd/m$^2$) |
| --- | --- | --- |
| 1 | 1-1 | 90 |
| 2 | 1-2 | 65 |
| 3 | 1-3 | 85 |
| 4 | 1-4 | 80 |
| 5 | 1-5 | 50 |
| 6 | 1-6 | 85 |

TABLE 3-continued

| Example | Compound | Brightness (cd/m$^2$) |
| --- | --- | --- |
| 7 | 2-1 | 80 |
| 8 | 2-2 | 50 |
| 9 | 2-3 | 85 |
| 10 | 2-4 | 75 |
| 11 | 2-5 | 80 |

EXAMPLE 12

Figure 2:
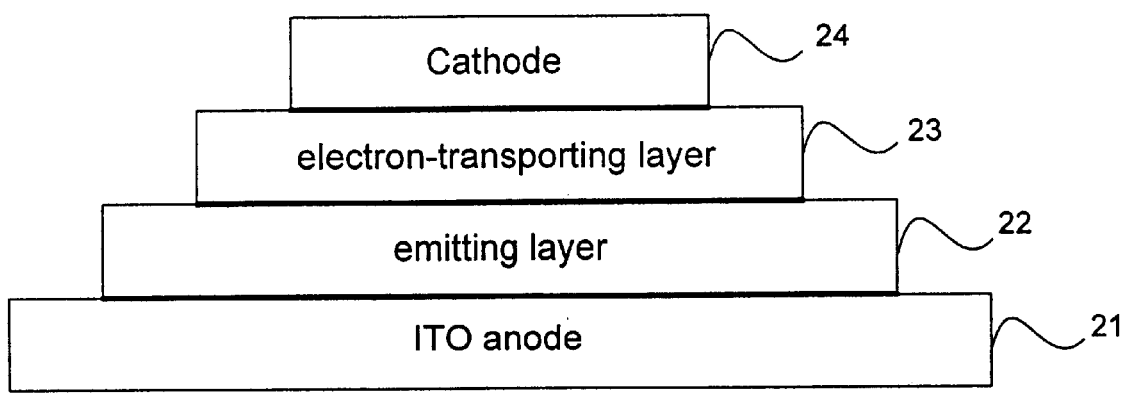
FIG. 2 illustrates another construction of an organic EL element of the present invention.

As shown in FIG. 2, a 20 nm emitting layer 22 is formed by vacuum deposition a compound (1-1) on the anode 21. Then, a 10 nm electron-transporting layer 23 is formed by vacuum deposition a compound (H) on the emitting layer 22. Finally, a 200 nm aluminum cathode 24 is formed by vacuum deposition on the organic layer. When a dc voltage of 21 V is applied to the resulting device, a blue light emission is obtained. In the similar manner as applied to example 12, example 13 through example 22 are fabricated and the results listed in Table 4 as follows:

TABLE 4

| Example | Compound | Brightness (cd/m$^2$) |
| --- | --- | --- |
| 12 | 1-1 | 230 |
| 13 | 1-2 | 150 |
| 14 | 1-3 | 280 |
| 15 | 1-4 | 210 |
| 16 | 1-5 | 120 |
| 17 | 1-6 | 195 |
| 18 | 2-1 | 185 |
| 19 | 2-2 | 110 |
| 20 | 2-3 | 240 |
| 21 | 2-4 | 210 |
| 22 | 2-5 | 230 |

Figure 3:
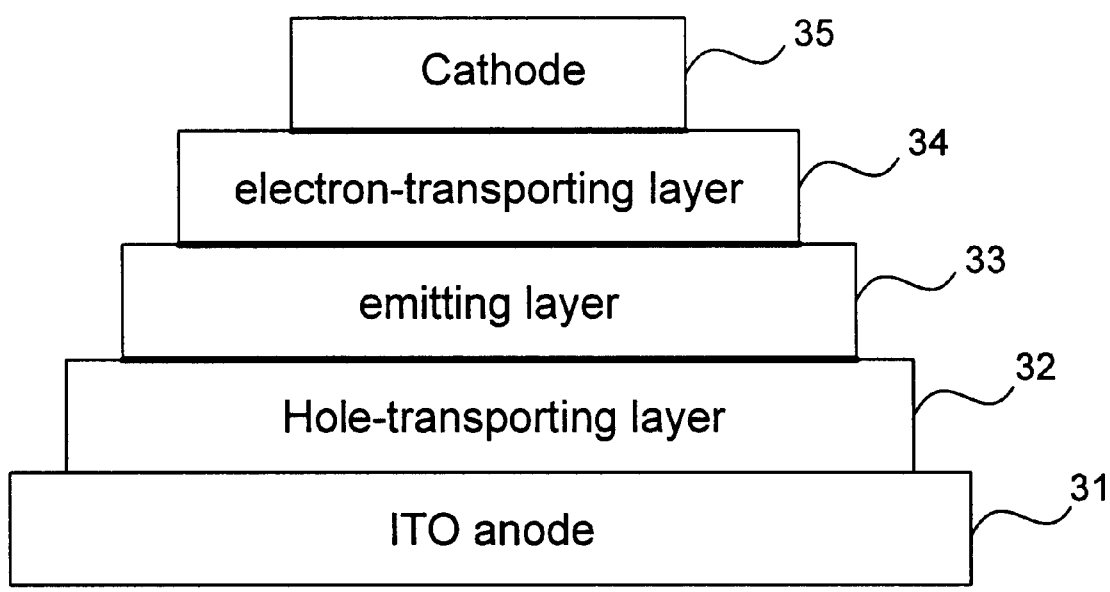
FIG. 3 illustrates yet another construction of an organic EL element of the present invention.

As shown in FIG. 3, a 30 nm hole-transporting layer 32 is formed by vacuum deposition a compond (B) on the anode 31. Over the hole-transporting layer 32, a 20 nm emitting layer 33 is formed by vacuum deposition a compound (1-1). Then, a 10 nm electron-transporting layer 34 is formed by vacuum deposition a compound (H) on the emitting layer 33. Finally, a 200 nm aluminum cathode 35 is formed by vacuum deposition on the organic layer. When a dc voltage of 21 V is applied to the resulting device, a blue light emission is obtained. In the similar manner as applied to example 23, example 24 through example 33 are fabricated and the results are listed in Table 5 as follows:

TABLE 5

| Example | compound | Brightness (cd/m$^2$) |
| --- | --- | --- |
| 23 | 1-1 | 420 |
| 24 | 1-2 | 165 |
| 25 | 1-3 | 400 |
| 26 | 1-4 | 370 |
| 27 | 1-5 | 150 |
| 28 | 1-6 | 400 |
| 29 | 2-1 | 350 |
| 30 | 2-2 | 120 |
| 31 | 2-3 | 350 |
| 32 | 2-4 | 350 |
| 33 | 2-5 | 400 |

EXAMPLE 34

As shown in FIG. 3 and in the similar manner as applied to example 12, electron-transporting layer 34 is formed by vacuum deposition a compound (j) on the anode 31. Then, a 200 nm aluminum cathode 35 is formed by vacuum deposition on the organic layer. When a dc voltage of 21 V is applied to the resulting device, a blue light emission is obtained. In the similar manner as applied to example 34, example 35 through example 37 is fabricated and the results listed in Table 6 as follows:

TABLE 6

| Example | Compound | Brightness (cd/m$^2$) |
|---|---|---|
| 34 | 1-1 | 900 |
| 35 | 1-4 | 800 |
| 36 | 2-1 | 850 |
| 37 | 2-4 | 900 |

What is claimed is:

1. An organic EL device comprising:

an anode;

a cathode; and at least one organic thin film layer including at light emitting layer adjacent said anode and said cathode, said at least one organic thin film layer containing a compound represented by the following formula (1) or (2):

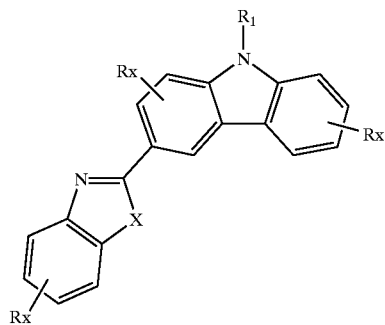

(1)

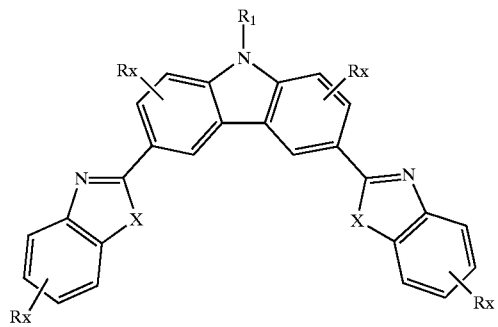

(2)

and wherein said $R_1$ represents a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, or a substituted or unsubstituted alkoxycarbonyl group; said Rx is one or more functional groups represented by a hydrogen atom, a halogen atom, a nitro group, a cyano group, a carboxyl group, or an $R_1$ any two of said Rx groups may form a ring; and said X represents an oxygen atom, an NH group or a sulfur atom.

2. The organic EL device as set forth in claim 1, comprising a plurality of organic thin film layers.

3. The organic EL device as set forth in claim 2, wherein said organic thin film layers comprise a light emitting layer and a hole-transporting layer, and said light emitting layer contains a compound of said formula (1) or (2).

4. The organic EL device as set forth in claim 2, wherein said organic thin film layers comprise a light emitting layer and a hole-transporting layer, and said hole-transporting layer contains a compound of said formula (1) or (2).

5. The organic EL device as set forth in claim 2, wherein said organic thin film layers comprise a light emitting layer, an electron-transporting layer, and a hole-transporting layer, and said light emitting layer contains a compound of said formula (1) or (2).

6. The organic EL device as set forth in claim 2, wherein said organic thin film layers comprise a light emitting layer, an electron-transporting layer, and a hole-transporting layer, and said hole-transporting layer contains a compound of said formula (1) or (2).

* * * * *